(12) United States Patent
Pagaila et al.

(10) Patent No.: US 8,896,109 B2
(45) Date of Patent: Nov. 25, 2014

(54) SEMICONDUCTOR DEVICE AND METHOD OF FORMING DIFFERENT HEIGHT CONDUCTIVE PILLARS TO ELECTRICALLY INTERCONNECT STACKED LATERALLY OFFSET SEMICONDUCTOR DIE

(71) Applicant: STATS ChipPAC, Ltd., Singapore (SG)

(72) Inventors: Reza A. Pagaila, Singapore (SG); Seng Guan Chow, Singapore (SG); Seung Uk Yoon, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/684,055

(22) Filed: Nov. 21, 2012

(65) Prior Publication Data
US 2013/0075903 A1    Mar. 28, 2013

Related U.S. Application Data

(62) Division of application No. 12/876,013, filed on Sep. 3, 2010, now Pat. No. 8,354,297.

(51) Int. Cl.
  *H01L 23/02* (2006.01)
  *H01L 23/06* (2006.01)
  (Continued)

(52) U.S. Cl.
  CPC . *H01L 23/49811* (2013.01); *H01L 2225/06548* (2013.01); *H01L 2224/04105* (2013.01);
  (Continued)

(58) Field of Classification Search
  USPC .......... 438/107, 109, 125–127, 614; 257/678, 257/684, 686, 687, E23.001, E23.003, 257/E23.015, E23.022, E23.123
  See application file for complete search history.

(56) References Cited

U.S. PATENT DOCUMENTS

| | | |
|---|---|---|
| 6,239,366 B1 | 5/2001 | Hsuan et al. |
| 7,402,901 B2 | 7/2008 | Hatano et al. |

(Continued)

*Primary Examiner* — Hsien Ming Lee
(74) *Attorney, Agent, or Firm* — Robert D. Atkins; Patent Law Group: Atkins and Associates, P.C.

(57) ABSTRACT

A semiconductor device has a first semiconductor die mounted over a carrier. Wettable contact pads can be formed over the carrier. A second semiconductor die is mounted over the first semiconductor die. The second die is laterally offset with respect to the first die. An electrical interconnect is formed between an overlapping portion of the first die and second die. A plurality of first conductive pillars is disposed over the first die. A plurality of second conductive pillars is disposed over the second die. An encapsulant is deposited over the first and second die and first and second conductive pillars. A first interconnect structure is formed over the encapsulant, first conductive pillars, and second die. The carrier is removed. A second interconnect structure is formed over the encapsulant, second conductive pillars, and first die. A third conductive pillar is formed between the first and second build-up interconnect structures.

24 Claims, 21 Drawing Sheets

(51) Int. Cl.
*H01L 23/22* (2006.01)
*H01L 21/44* (2006.01)
*H01L 21/50* (2006.01)
*H01L 25/065* (2006.01)
*H01L 23/00* (2006.01)
*H01L 25/16* (2006.01)
*H01L 23/498* (2006.01)
*H01L 25/00* (2006.01)
*H01L 23/538* (2006.01)
*H01L 21/56* (2006.01)
*H01L 25/10* (2006.01)
*H01L 23/31* (2006.01)

(52) U.S. Cl.
CPC . H01L 2225/107 (2013.01); H01L 2224/05639 (2013.01); *H01L 25/0652* (2013.01); H01L 2224/05611 (2013.01); H01L 2924/15311 (2013.01); *H01L 24/17* (2013.01); H01L 2224/03464 (2013.01); H01L 2924/01074 (2013.01); H01L 23/3128 (2013.01); H01L 2224/16145 (2013.01); *H01L 25/16* (2013.01); H01L 2225/06541 (2013.01); H01L 2225/1052 (2013.01); H01L 2924/01079 (2013.01); *H01L 24/97* (2013.01); H01L 2224/05647 (2013.01); H01L 2924/01049 (2013.01); H01L 2924/01078 (2013.01); H01L 2924/01029 (2013.01); H01L 2224/13025 (2013.01); H01L 2224/16225 (2013.01); H01L 2924/12041 (2013.01); *H01L 24/19* (2013.01); H01L 2924/01047 (2013.01); H01L 2924/13091 (2013.01); H01L 2225/06524 (2013.01); H01L 2224/18 (2013.01); H01L 2924/01082 (2013.01); H01L 2224/05624 (2013.01); H01L 2924/01322 (2013.01); H01L 2224/16227 (2013.01); H01L 2225/06517 (2013.01); H01L 2224/0557 (2013.01); H01L 2924/014 (2013.01); H01L 2225/06562 (2013.01); H01L 2225/1058 (2013.01); *H01L 25/50* (2013.01); H01L 2924/01073 (2013.01); *H01L 23/5389* (2013.01); *H01L 21/568* (2013.01); *H01L 25/105* (2013.01); H01L 2224/05655 (2013.01); H01L 2224/0401 (2013.01); H01L 2225/1035 (2013.01); H01L 2224/16146 (2013.01); H01L 2924/01013 (2013.01); H01L 2224/03462 (2013.01); H01L 2225/06513 (2013.01); H01L 2224/1703 (2013.01); H01L 2924/01004 (2013.01); *H01L 25/0657* (2013.01); H01L 2224/05644 (2013.01); *H01L 21/561* (2013.01)
USPC .......... 257/678; 257/684; 257/686; 257/687; 438/107; 438/109; 438/126; 438/127

(56) References Cited

U.S. PATENT DOCUMENTS

| | | | |
|---|---|---|---|
| 8,097,490 | B1 | 1/2012 | Pagaila et al. |
| 8,110,440 | B2 | 2/2012 | Bathan et al. |
| 8,236,607 | B2 | 8/2012 | Bathan et al. |
| 2007/0108580 | A1 | 5/2007 | Goller |
| 2008/0150157 | A1 | 6/2008 | Nishimura et al. |
| 2008/0150187 | A1 | 6/2008 | Daniel et al. |
| 2009/0091022 | A1 | 4/2009 | Meyer et al. |
| 2010/0289131 | A1 | 11/2010 | Bathan et al. |

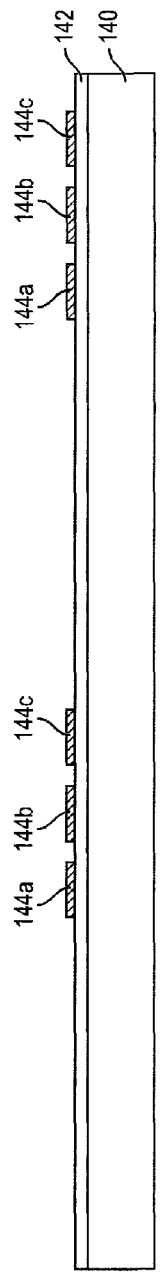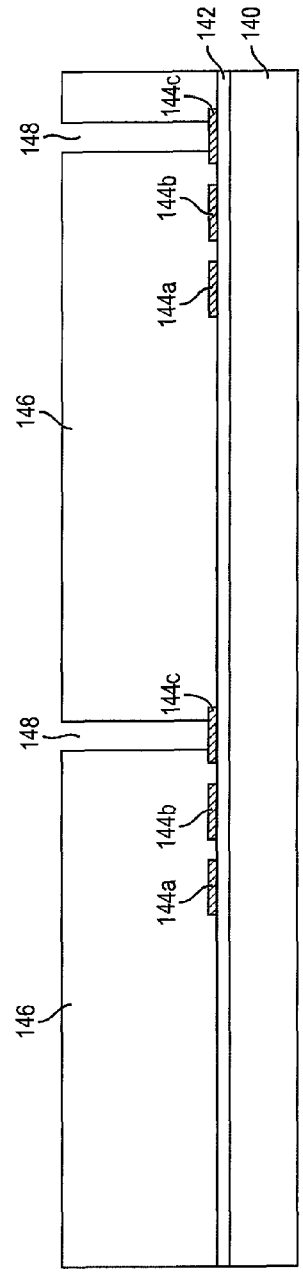

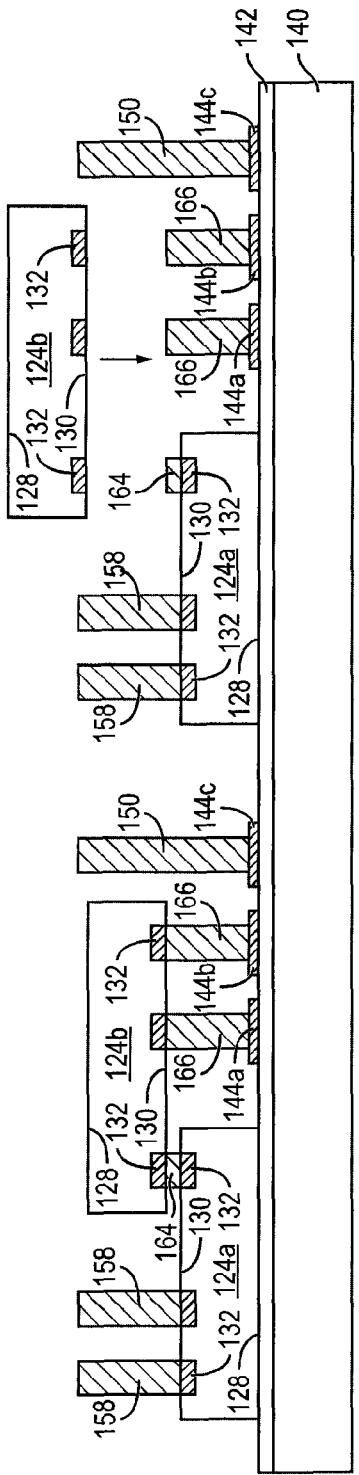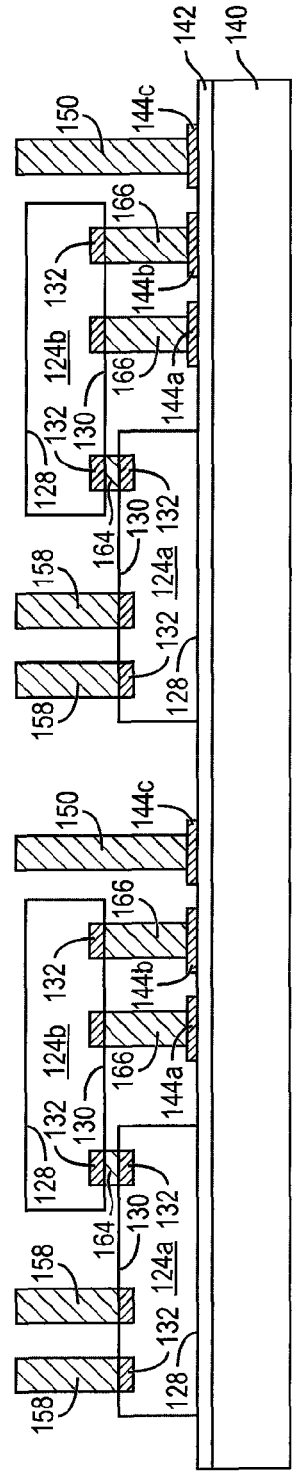

SEMICONDUCTOR DEVICE AND METHOD OF FORMING DIFFERENT HEIGHT CONDUCTIVE PILLARS TO ELECTRICALLY INTERCONNECT STACKED LATERALLY OFFSET SEMICONDUCTOR DIE

CLAIM TO DOMESTIC PRIORITY

The present application is a division of U.S. patent application Ser. No. 12/876,013, now U.S. Pat. No. 8,354,297, filed Sep. 3, 2010, which application is incorporated herein by reference.

FIELD OF THE INVENTION

The present invention relates in general to semiconductor devices and, more particularly, to a semiconductor device and method of forming different height conductive pillars to electrically interconnect stacked, laterally offset semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a conventional fan-out wafer level chip scale package (Fo-WLCSP), semiconductor die are commonly embedded in an encapsulant over a temporary carrier. Top and bottom build-up interconnect structures are formed over opposite surfaces of the encapsulant. In the case of stacking multiple semiconductor die within the Fo-WLCSP, the die are typically mounted back surface-to-back surface to allow the active surfaces of the die ready electrical connection to the build-up interconnect structures. A plurality of z-direction vertical conductive pillars is formed through the encapsulant to electrically connect the top and bottom build-up interconnect structures. The active surfaces of the stacked semiconductor die are thus electrically connected through the top and bottom build-up interconnect structures and conductive pillars, which makes for a long electrical path and reduced electrical performance between the semiconductor die.

The stacked semiconductor die can be mounted active surface-to-active surface within the Fo-WLCSP. In this case, a plurality of conductive through silicon vias (TSV) is formed through the semiconductor die to make electrical connection between the active surfaces and top and bottom build-up interconnect structures. The formation of conductive TSV through the semiconductor die adds cost and complexity to the manufacturing process.

SUMMARY OF THE INVENTION

A need exists for a simple and cost-effective vertical electrical interconnect structure disposed between stacked semiconductor die. Accordingly, in one embodiment, the present invention is a semiconductor device comprising a first semiconductor die and second semiconductor die disposed over a portion of the first semiconductor die and laterally offset from the first semiconductor die. A plurality of first conductive pillars is disposed over the first semiconductor die or second semiconductor die. An encapsulant is deposited around the first semiconductor die and second semiconductor die and first conductive pillars.

In another embodiment, the present invention is a semiconductor device comprising a first semiconductor die and second semiconductor die disposed over and laterally offset from the first semiconductor die. A plurality of first conductive pillars is disposed over the first semiconductor die or second semiconductor die.

In another embodiment, the present invention is a semiconductor device comprising a first semiconductor die and second semiconductor die disposed over and laterally offset from the first semiconductor die. A first interconnect structure is disposed over the first semiconductor die or second semiconductor die. An encapsulant is deposited around the first semiconductor die and second semiconductor die and first interconnect structure.

In another embodiment, the present invention is a semiconductor device comprising a first semiconductor die and second semiconductor die disposed over and laterally offset from the first semiconductor die. A first interconnect structure is disposed over the first semiconductor die or second semiconductor die.

DETAILED DESCRIPTION OF THE DRAWINGS

Figure 1:
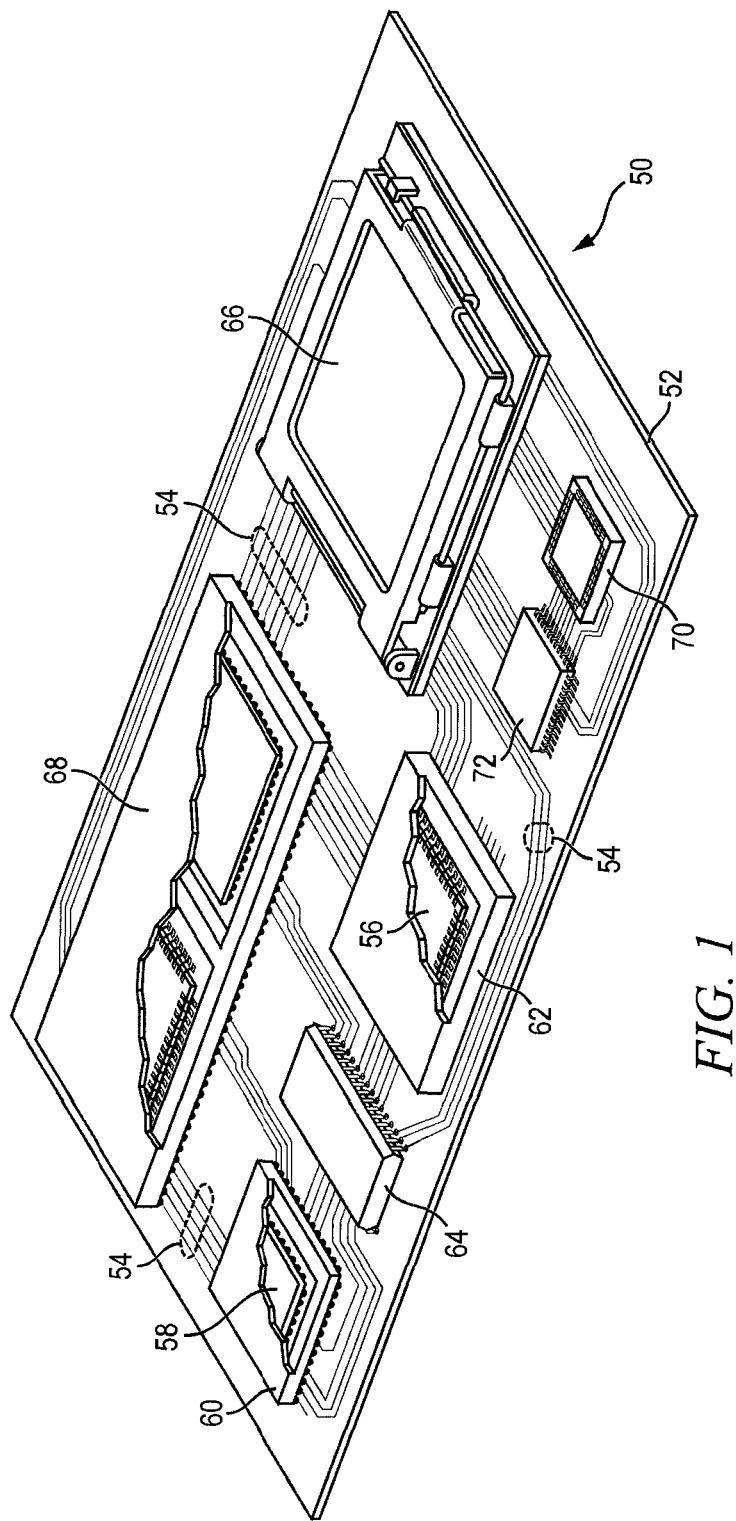
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist masking, over the layer to be patterned. A pattern is transferred from a photomask to the photoresist masking using light. The portion of the photoresist masking pattern subjected to light is removed using a solvent, exposing portions of the underlying layer to be patterned. The remainder of the photoresist masking is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
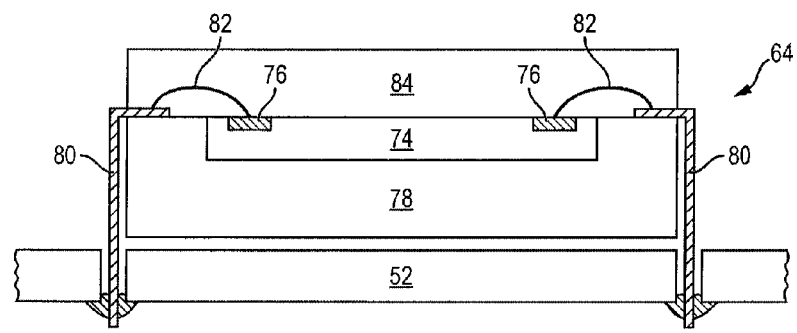
FIGS. 2a-2c illustrate further detail of the representative semiconductor packages mounted to the PCB.
Figure 2B:
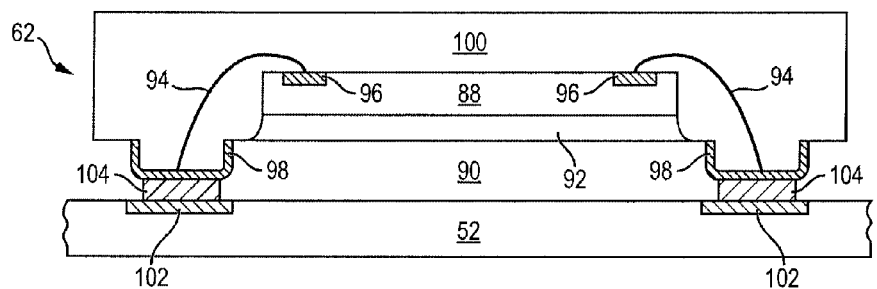
Figure 2C:
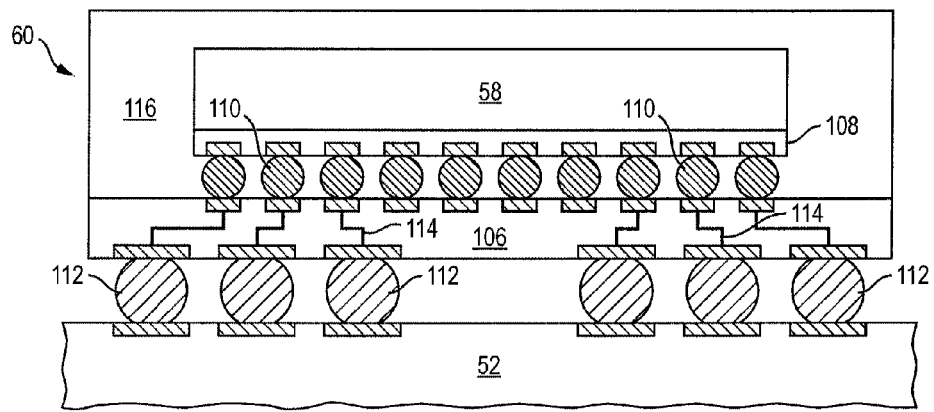

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
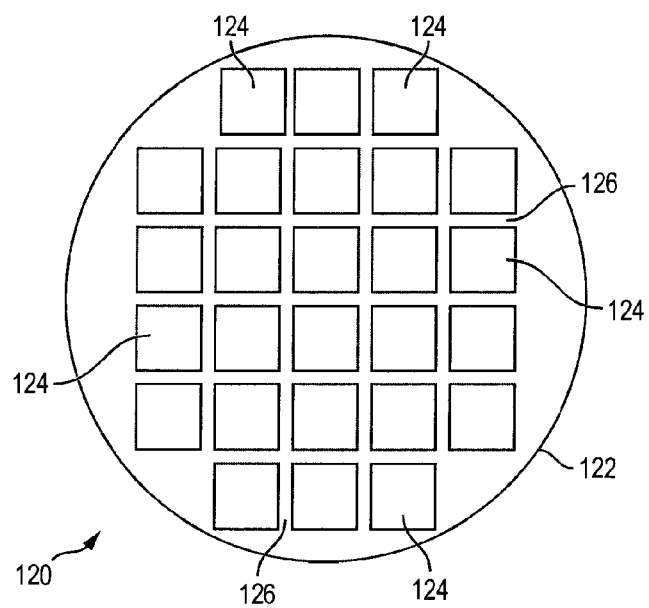
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
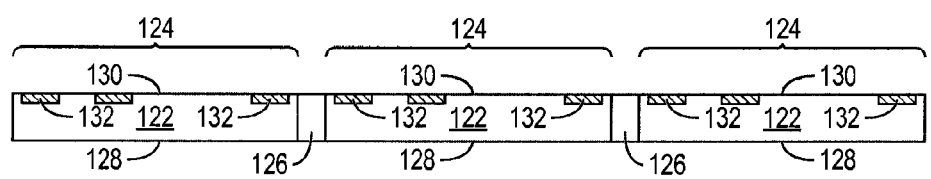

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

Figure 3C:
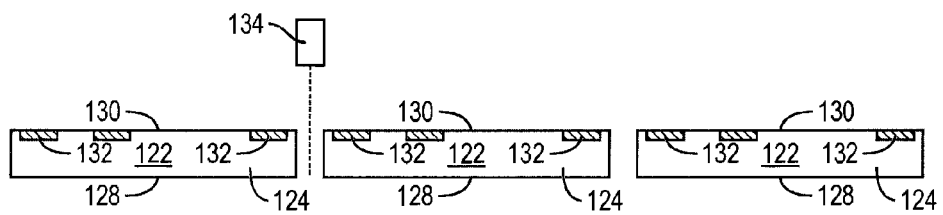

In FIG. 3c, semiconductor wafer 120 is singulated through saw street 126 using a saw blade or laser cutting tool 134 into individual semiconductor die 124.

Figure 4D:
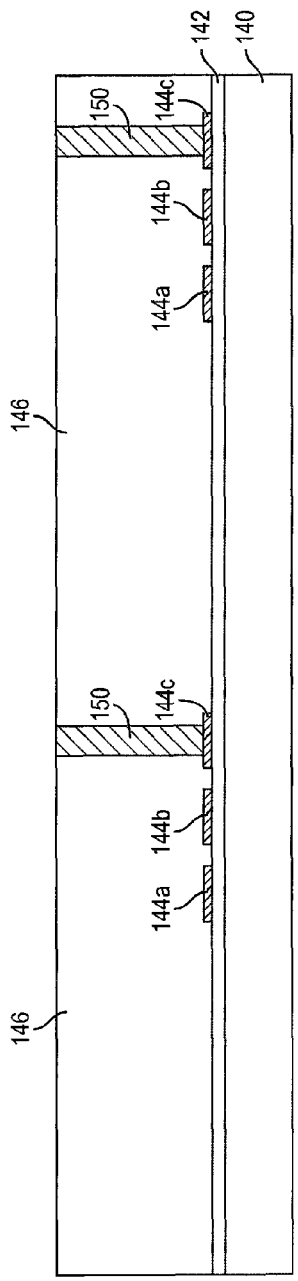
FIGS. 4a-4s illustrate a process of forming different height conductive pillars to electrically interconnect stacked, laterally offset semiconductor die.
Figure 4E:
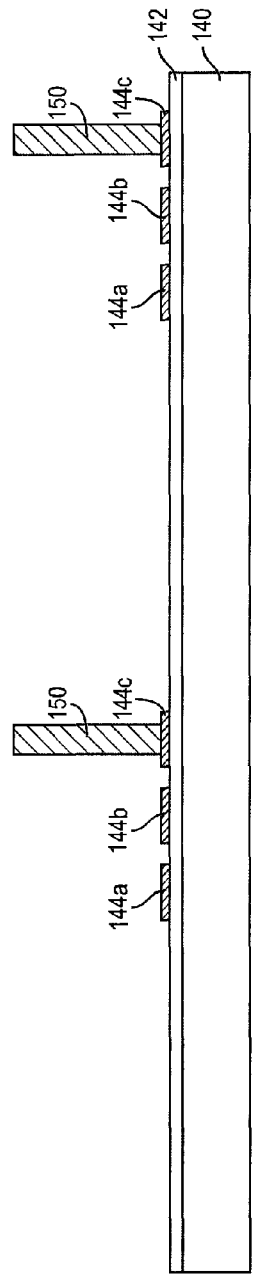
Figure 4F:
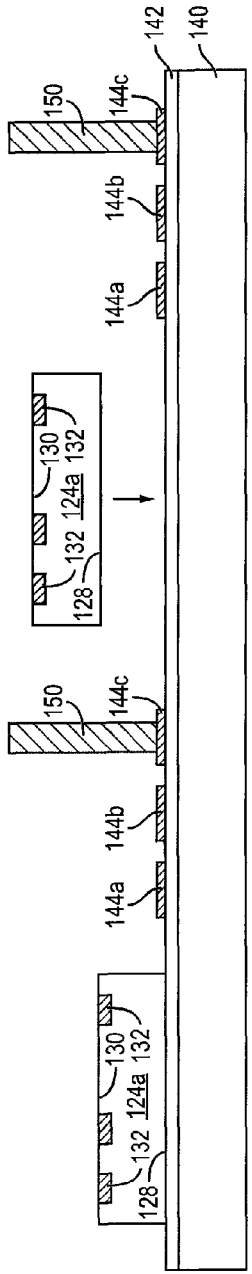
Figure 4G:
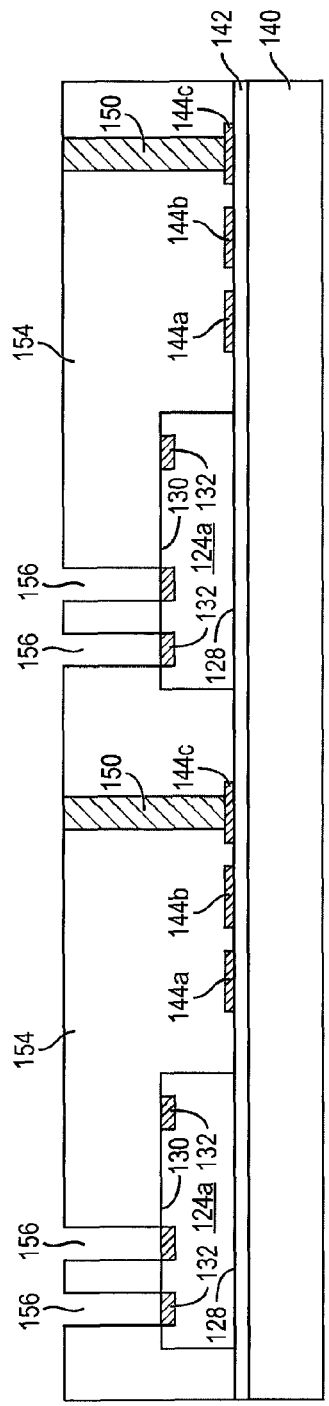
Figure 4H:
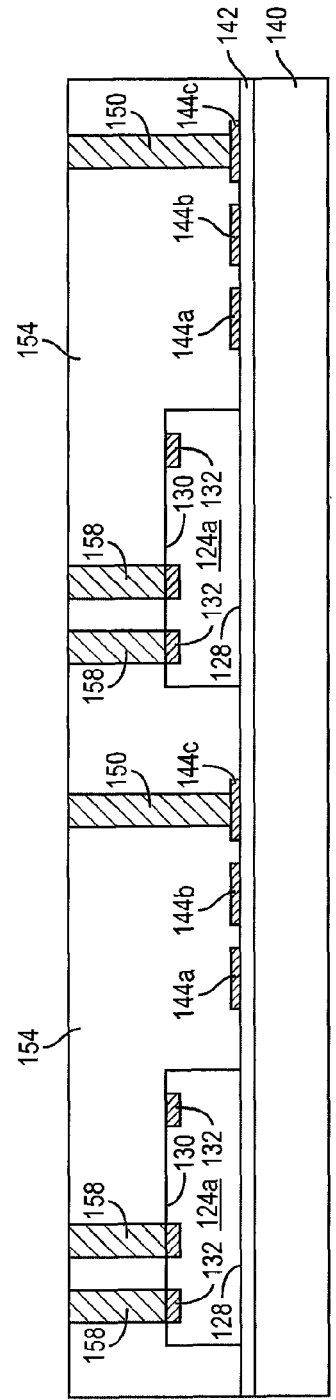
Figure 4I:
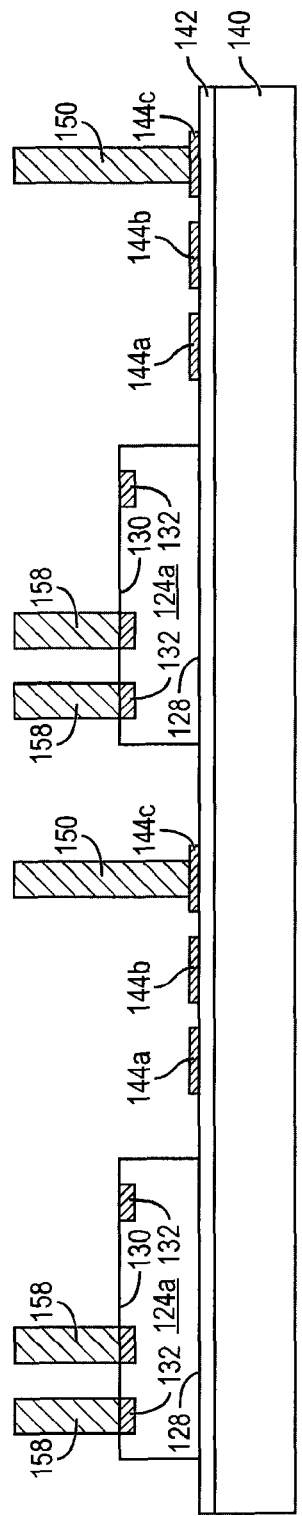
Figure 4J:
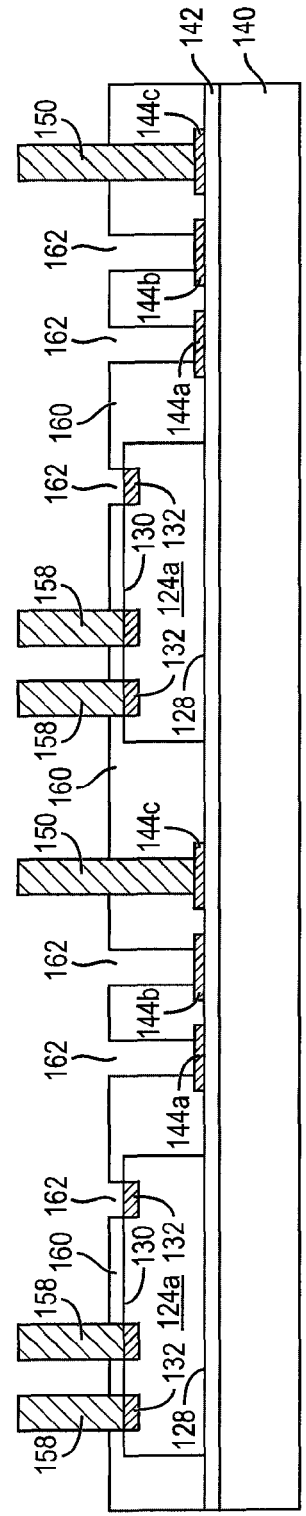
Figure 4K:
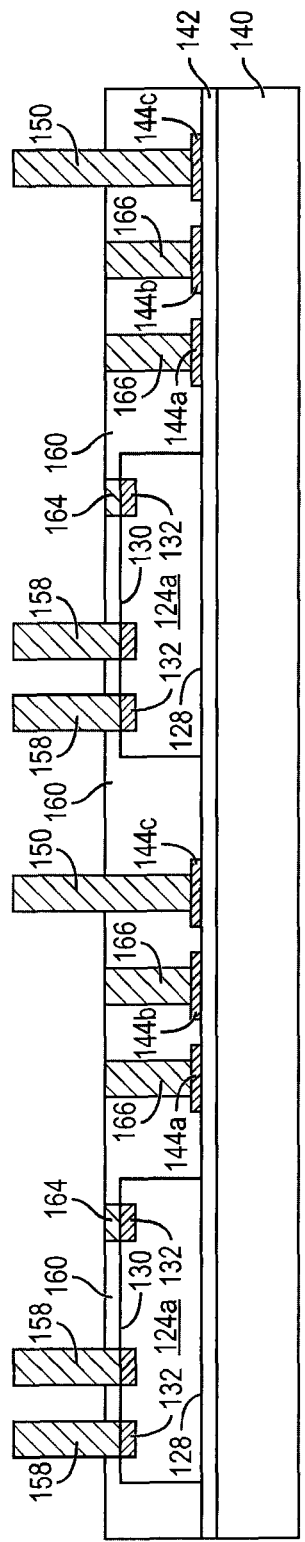
Figure 4L:
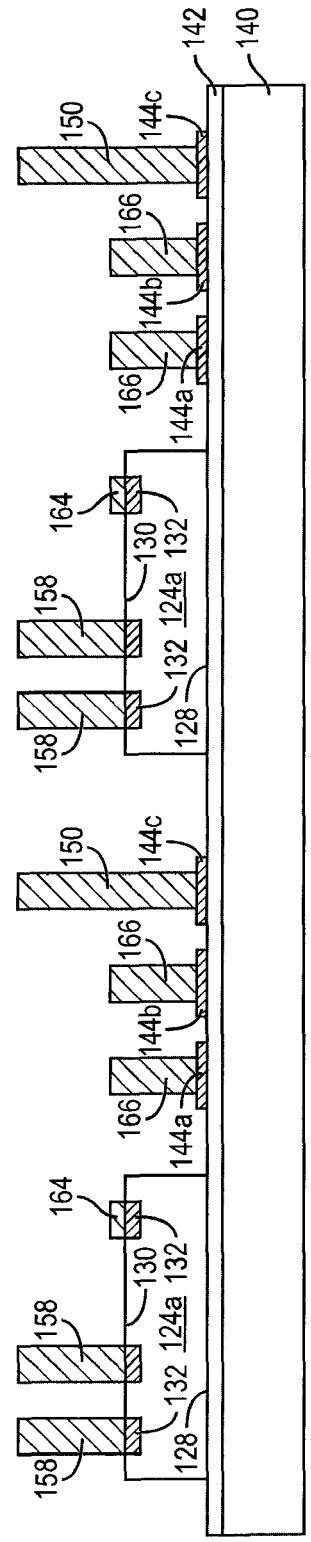
Figure 4O:
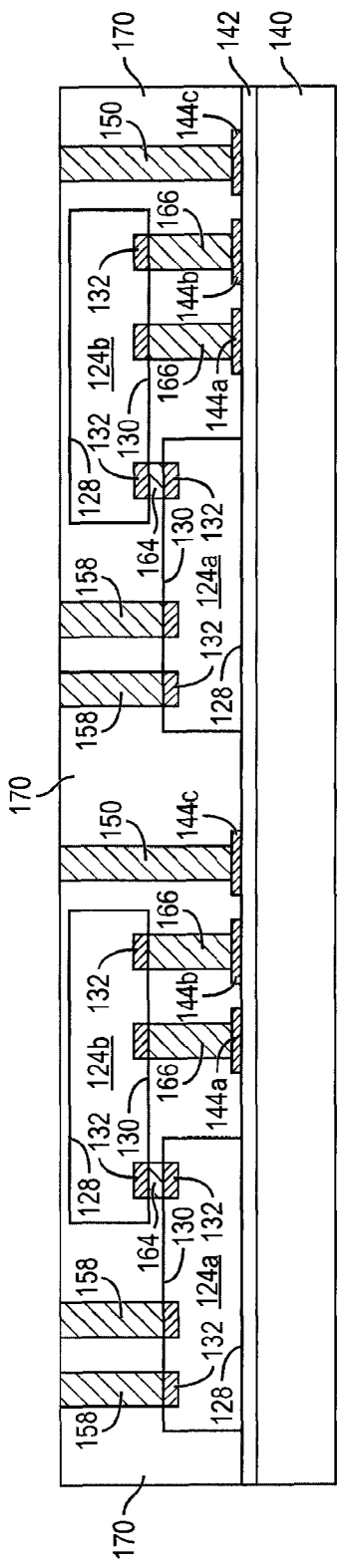
Figure 4P:
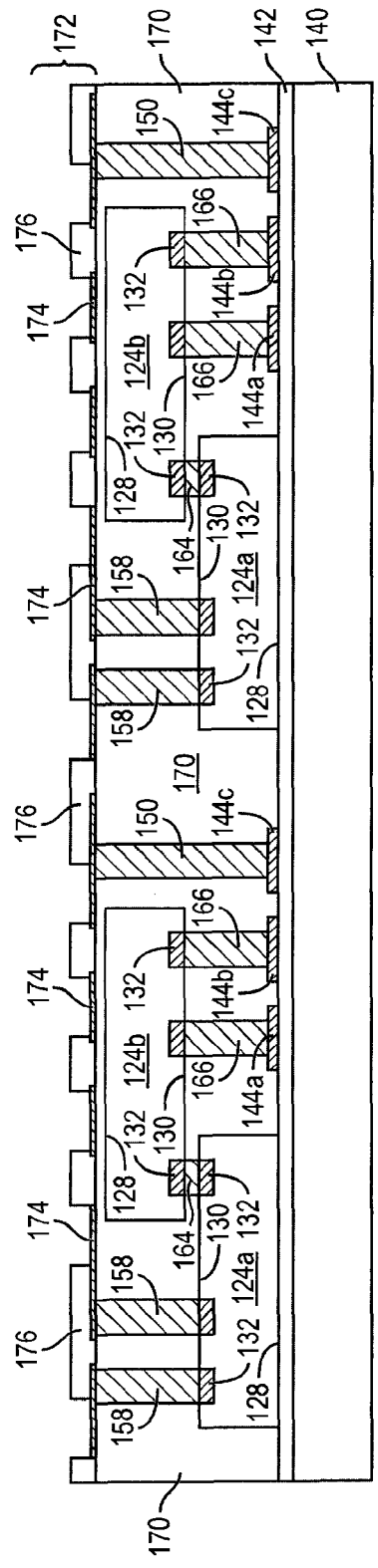
Figure 4Q:
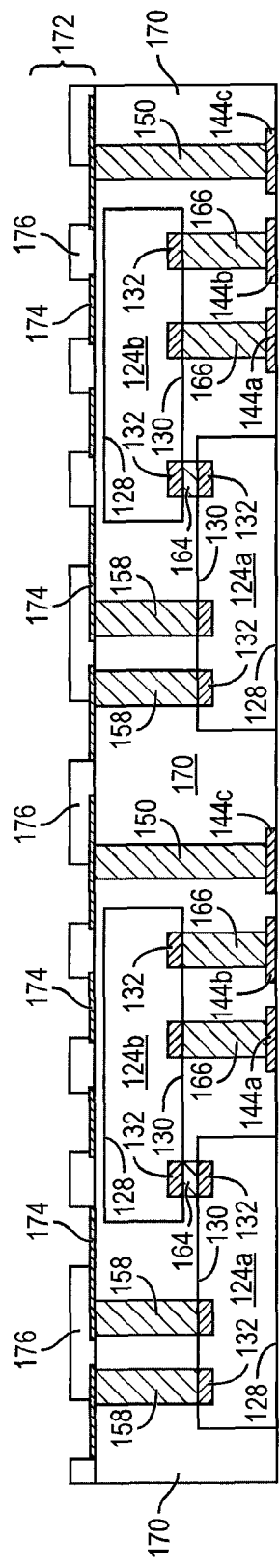
Figure 4R:
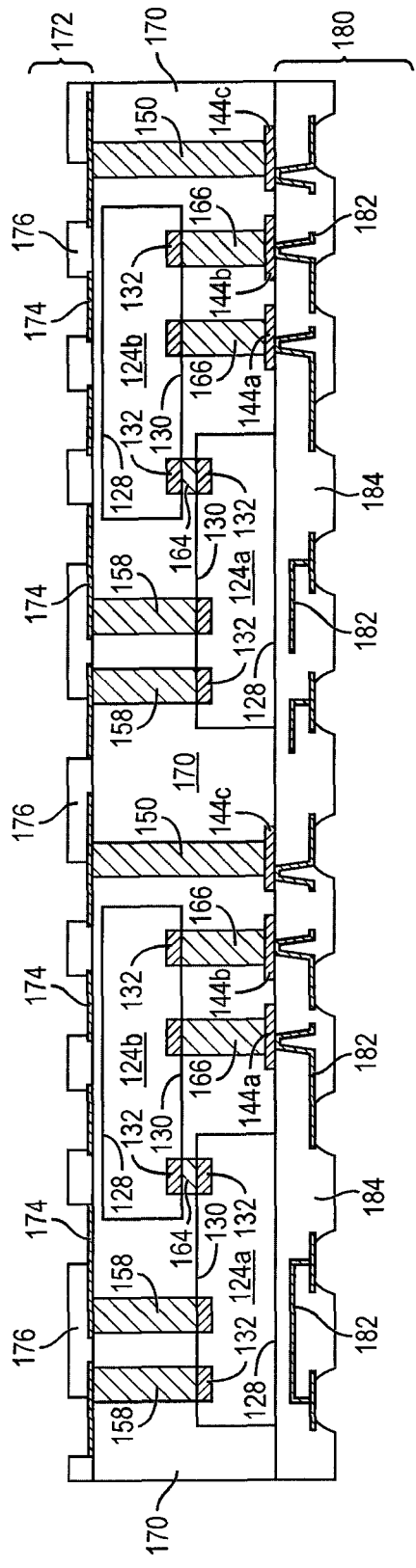
Figure 4S:
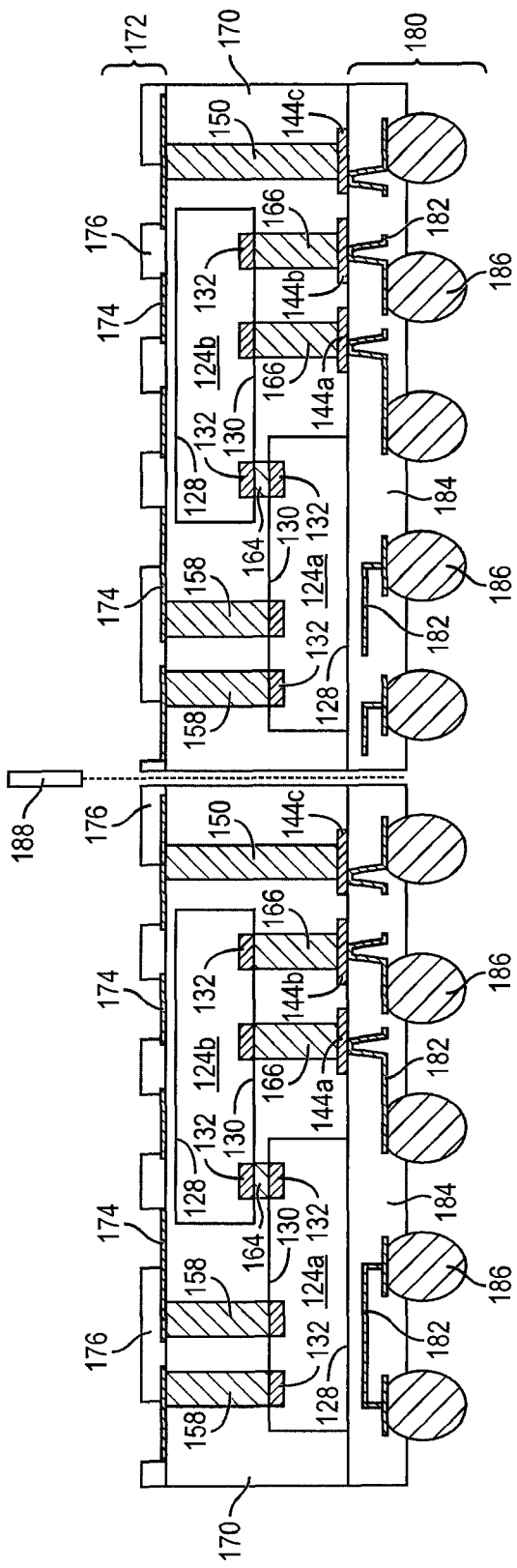

FIGS. 4a-4s illustrate, in relation to FIGS. 1 and 2a-2c, a process of forming different height conductive pillars to electrically interconnect stacked, laterally offset semiconductor die in a Fo-WLCSP. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

In FIG. 4b, an electrically conductive layer 144 is formed over interface layer 142 of carrier 140 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 operates as wettable contact pads containing flux material.

In FIG. 4c, a photoresist masking layer 146 is formed over interface layer 142 and conductive layer 144. A portion of photoresist masking layer 146 is removed over contact pads 144c by an etching process to form vias 148 down to the contact pads. In FIG. 4d, vias 148 are filled with Al, Cu, Sn, Ni, Au, Ag, titanium (Ti), tungsten (W), poly-silicon, or other suitable electrically conductive material using electrolytic plating, electroless plating process, or other suitable metal deposition process. In FIG. 4e, photoresist masking layer 146 is removed leaving z-direction vertical interconnect conductive pillars 150 over contact pads 144c.

In FIG. 4f, semiconductor die 124a from FIGS. 3a-3c are mounted over and secured to interface layer 142 with back surface 128 oriented toward carrier 140 using a pick and place operation. In FIG. 4g, a photoresist masking layer 154 is formed over interface layer 142, semiconductor die 124a, and conductive layer 144. A portion of photoresist masking layer 154 is removed over contact pads 132 of semiconductor die 124a by an etching process to form vias 156 down to the contact pads. In FIG. 4h, vias 156 are filled with Al, Cu, Sn, Ni, Au, Ag, Ti, W, poly-silicon, or other suitable electrically conductive material using electrolytic plating, electroless plating process, or other suitable metal deposition process. In FIG. 4i, photoresist masking layer 154 is removed leaving z-direction vertical interconnect conductive pillars 158 over contact pads 132. Conductive pillars 158 have a different height than conductive pillars 150 by nature of the different depths of vias 148 and 156.

In FIG. 4j, a photoresist masking layer 160 is formed over interface layer 142, semiconductor die 124a, and conductive layer 144. A portion of photoresist masking layer 160 is removed over contact pads 132, 144a, and 144b by an etching process to form vias 162 down to the contact pads. In FIG. 4k, vias 162 are filled with Al, Cu, Sn, Ni, Au, Ag, Ti, W, poly-silicon, or other suitable electrically conductive material using electrolytic plating, electroless plating process, or other suitable metal deposition process. In FIG. 4l, photoresist masking layer 160 is removed leaving z-direction vertical interconnect conductive pillars 164 over contact pads 132 and conductive pillars 166 over conductive layer 144a and 144b. Conductive pillars 164 have a different height than conductive pillars 166 by nature of the different depths of vias 162.

In FIG. 4m, semiconductor die 124b from FIGS. 3a-3c are mounted over conductive pillars 164 and 166 with active surface 130 oriented toward carrier 140 using a pick and place operation. A solder paste can be applied over conductive pillars 164 and 166 prior to mounting semiconductor die 124b to improve the metallurgical connection. In another embodiment, instead of conductive pillar 164, a bump or stud bump is formed between contact pads 132 in the overlapping portion of semiconductor die 124a and 124b.

FIG. 4n shows contact pads 132 of semiconductor die 124b metallurgically and electrically connected through conductive pillars 164 and 166 to contact pads 132 of semiconductor die 124a and conductive layer 144a and 144b. Semiconductor die 124b is stacked active surface-to-active surface with a lateral offset with respect to semiconductor die 124a. That is, a portion of semiconductor die 124b is disposed over a footprint of semiconductor die 124a, and a portion of semiconductor die 124b is disposed outside the footprint of semiconductor die 124a. Consequently, a portion of semiconductor die 124b overlaps a portion of semiconductor die 124a. Semiconductor die 124b can be a different size and have a different electrical function than semiconductor die 124a.

In FIG. 4o, an encapsulant or molding compound 170 is deposited over carrier 140, semiconductor die 124a and 124b, and around conductive pillars 150, 158, 164, and 166 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants. Wettable contact pads 144 hold semiconductor die 124a and 124b securely in place to reduce die shifting during encapsulation.

In FIG. 4p, a build-up interconnect structure 172 is formed over encapsulant 170 opposite carrier 140. The build-up interconnect structure 172 includes an electrically conductive layer or redistribution layer (RDL) 174 formed using a patterning and metal deposition process such as sputtering, electrolytic plating, and electroless plating. Conductive layer 174 can be one or more layers of Al, Cu, Sn, Ni, Au, Ag, or other suitable electrically conductive material. One portion of conductive layer 174 is electrically connected to conductive pillars 150 and 158. Other portions of conductive layer 174 can be electrically common or electrically isolated depending on the design and function of semiconductor die 124a and 124b.

An insulating or passivation layer 176 is formed around conductive layer 174 for electrical isolation using PVD, CVD, printing, spin coating, spray coating, sintering or thermal oxidation. The insulating layer 176 contains one or more layers of silicon dioxide ($SiO_2$), silicon nitride ($Si_3N_4$), silicon oxynitride (SiON), tantalum pentoxide ($Ta_2O_5$), aluminum oxide (Al2O3), or other material having similar insulating and structural properties. A portion of insulating layer 176 can be removed by an etching process to expose conductive layer 174 for additional electrical interconnect.

In FIG. 4*q*, carrier 140 and interface layer 142 are removed by chemical etching, mechanical peeling, CMP, mechanical grinding, thermal bake, UV light, laser scanning, or wet stripping to expose semiconductor die 124*a*, conductive layer 144, conductive pillars 150 and 166, and encapsulant 170.

In FIG. 4*r*, a build-up interconnect structure 180 is formed over semiconductor die 124*a* and 124*b*, conductive layer 144, conductive pillars 150 and 166, and encapsulant 170, opposite build-up interconnect structure 172. The build-up interconnect structure 180 includes an electrically conductive layer or RDL 182 formed using a patterning and metal deposition process such as sputtering, electrolytic plating, and electroless plating. Conductive layer 182 can be one or more layers of Al, Cu, Sn, Ni, Au, Ag, or other suitable electrically conductive material. One portion of conductive layer 182 is electrically connected to conductive pillars 150 and 166. Other portions of conductive layer 182 can be electrically common or electrically isolated depending on the design and function of semiconductor die 124*a* and 124*b*.

An insulating or passivation layer 184 is formed around conductive layer 182 for electrical isolation using PVD, CVD, printing, spin coating, spray coating, sintering or thermal oxidation. The insulating layer 184 contains one or more layers of SiO2, Si3N4, SiON, Ta2O5, Al2O3, or other material having similar insulating and structural properties. A portion of insulating layer 184 can be removed by an etching process to expose conductive layer 182 for additional electrical interconnect.

In FIG. 4*s*, an electrically conductive bump material is deposited over build-up interconnect structure 180 and electrically connected to the exposed portion of conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is reflowed by heating the material above its melting point to form spherical balls or bumps 186. In some applications, bumps 186 are reflowed a second time to improve electrical contact to conductive layer 182. An under bump metallization (UBM) can be formed under bumps 186. The bumps can also be compression bonded to conductive layer 182, or a combination of reflow temperature and pressure. Bumps 186 represent one type of interconnect structure that can be formed over conductive layer 182. The interconnect structure can also use stud bump, micro bump, or other electrical interconnect.

Figure 5:
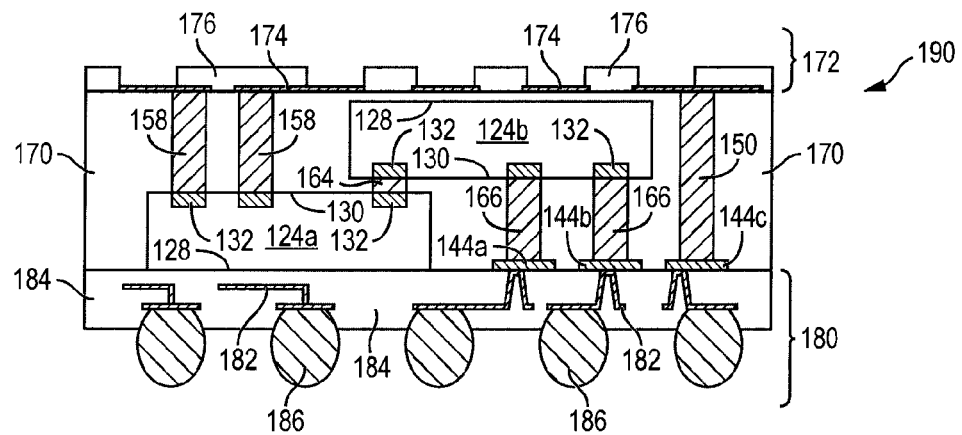
FIG. 5 illustrates a Fo-WLCSP with different height conductive pillars to electrically interconnect stacked, laterally offset semiconductor die.

Semiconductor die 124*a* and 124*b* are singulated through encapsulant 170 and build-up interconnect structures 172 and 180 with saw blade or laser cutting tool 188 into individual Fo-WLCSP 190. FIG. 5 shows Fo-WLCSP 190 after singulation. Semiconductor die 124*a* is electrically connected through contact pads 132 and conductive pillars 158 to build-up interconnect structure 172 and through conductive pillars 164 to contact pads 132 of semiconductor die 124*b*. Semiconductor die 124*b* is electrically connected through contact pads 132 and conductive pillars 166 to build-up interconnect structure 180 and through conductive pillar 164 to contact pads 132 of semiconductor die 124*a*. The build-up interconnect structure 172 is electrically connected through conductive pillars 150 to build-up interconnect structure 180. In another embodiment, bond wires can be formed between contact pads 132 of semiconductor die 124*a* and 124*b* and build-up interconnect structures 172 and 180.

Semiconductor die 124*a* and 124*b* are stacked active surface-to-active surface with a lateral offset, in that a portion of semiconductor die 124*b* is disposed over a footprint of semiconductor die 124*a* and a portion of semiconductor die 124*b* is disposed outside the footprint of semiconductor die 124*a*. Consequently, a portion of semiconductor die 124*b* overlaps a portion of semiconductor die 124*a*. Since semiconductor die 124*a* and 124*b* are stacked active surface-to-active surface, the short electrical path between contact pads 132 of the overlapping portion of semiconductor die 124*a* and 124*b*, i.e., through conductive pillar 164, improves the electrical performance of the Fo-WLCSP 190. In addition, IPDs can be formed over or within build-up interconnect structures 172 and 180 for additional RF signal processing.

Figure 6:
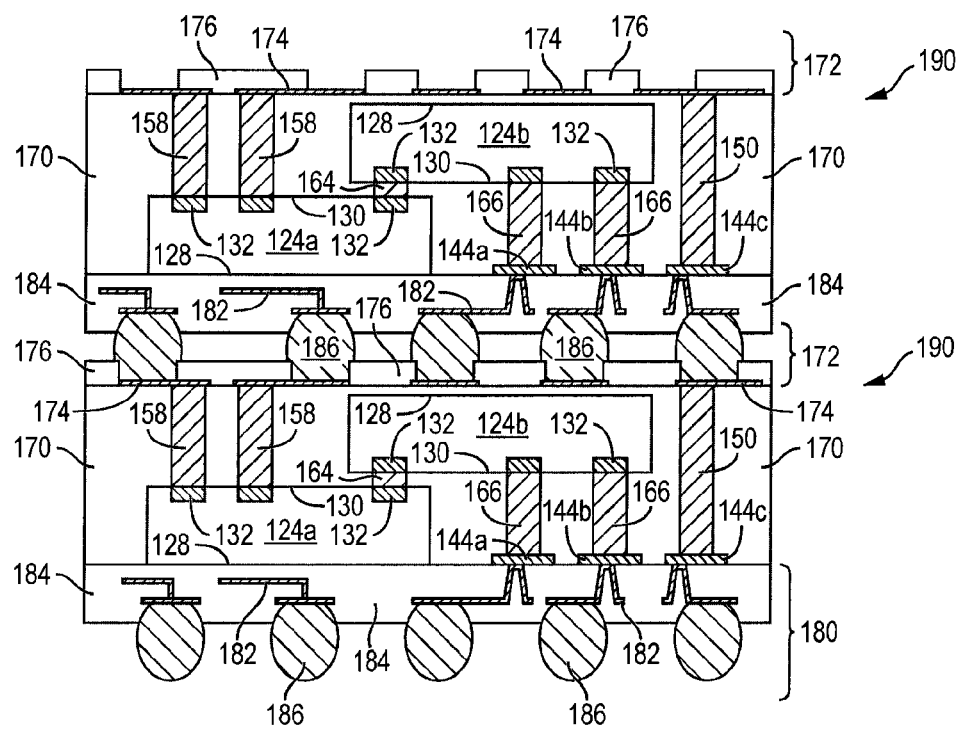
FIG. 6 illustrates two stacked Fo-WLCSP each with different height conductive pillars to electrically interconnect stacked, laterally offset semiconductor die.

FIG. 6 shows two stacked Fo-WLCSP 190 electrically connected through build-up interconnect structures 172 and 180, bumps 186, and conductive pillars 150.

Figure 7A:
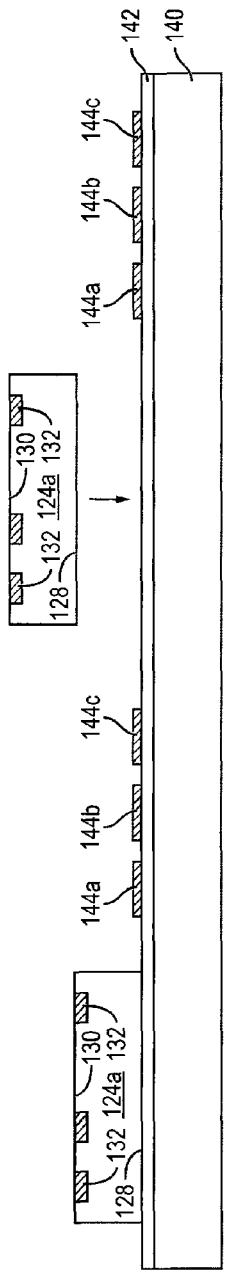
FIGS. 7a-7l illustrate another process of forming different height conductive pillars to electrically interconnect stacked, laterally offset semiconductor die.
Figure 7B:
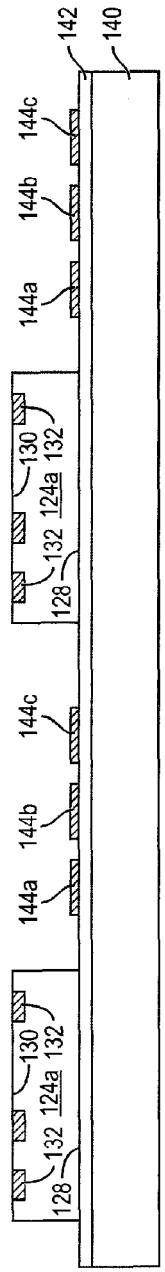

FIGS. 7*a*-7*l* illustrate, in relation to FIGS. 1 and 2*a*-2*c*, another process of forming different height conductive pillars to electrically interconnect stacked, laterally offset semiconductor die in a Fo-WLCSP. Continuing from FIG. 4*b*, semiconductor die 124*a* from FIGS. 3*a*-3*c* are mounted over and secured to interface layer 142 with back surface 128 oriented toward carrier 140 using a pick and place operation, as shown in FIGS. 7*a*-7*b*.

Figure 7C:
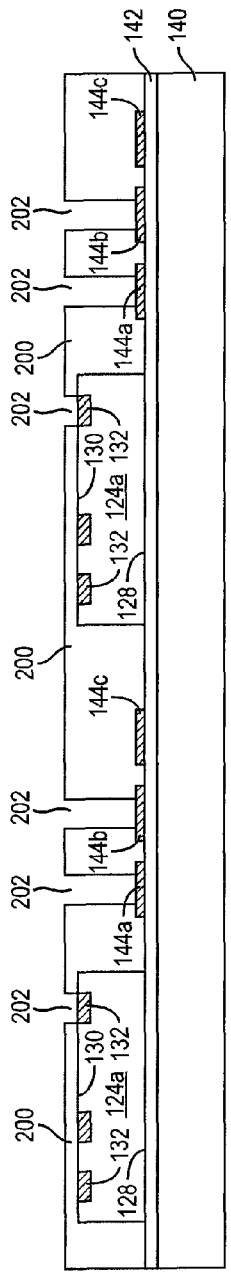
Figure 7D:
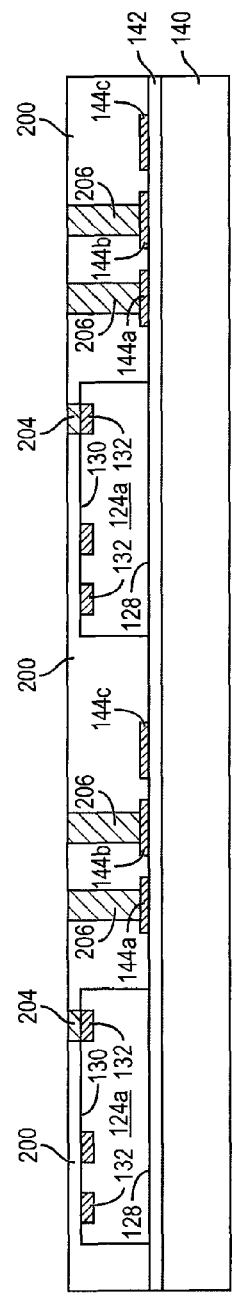

In FIG. 7*c*, a photoresist masking layer 200 is formed over interface layer 142, semiconductor die 124*a*, and conductive layer 144. A portion of photoresist masking layer 200 is removed over contact pads 132 of semiconductor die 124*a* and conductive layer 144*a* and 144*b* by an etching process to form vias 202 down to the contact pads. In FIG. 7*d*, vias 202 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive pillars 204 and 206 over contact pads 132, 144*a*, and 144*b*.

Figure 7E:
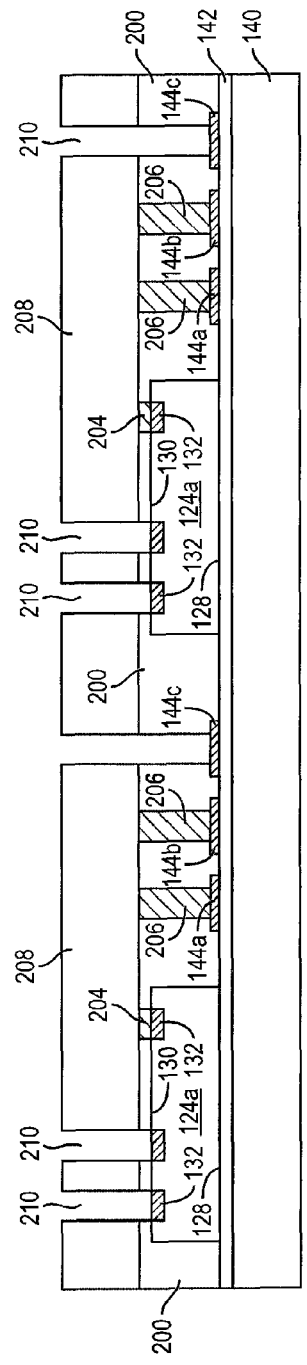
Figure 7F:
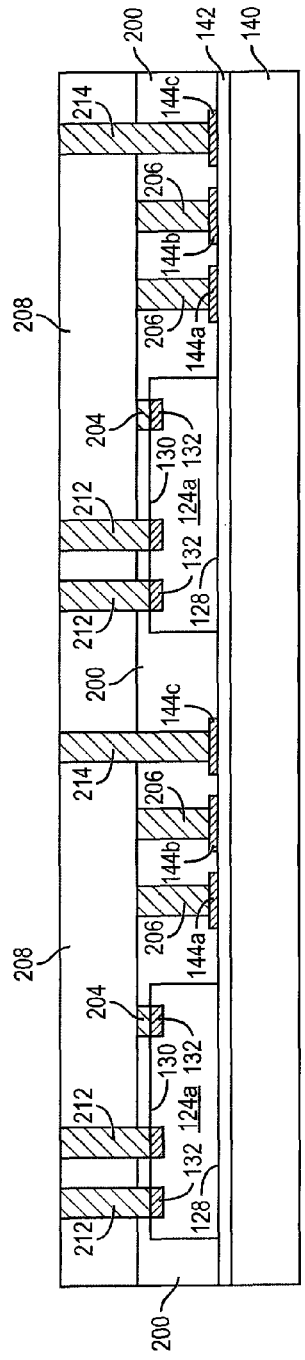

In FIG. 7*e*, a photoresist masking layer 208 is formed over photoresist masking layer 200 and conductive pillars 204 and 206. A portion of photoresist masking layer 208 is removed over contact pads 132 and 144*c* by an etching process to form vias 210 down to the contact pads. In FIG. 7*f*, vias 210 are filled with Al, Cu, Sn, Ni, Au, Ag, Ti, W, poly-silicon, or other suitable electrically conductive material using electrolytic plating, electroless plating process, or other suitable metal deposition process.

Figure 7G:
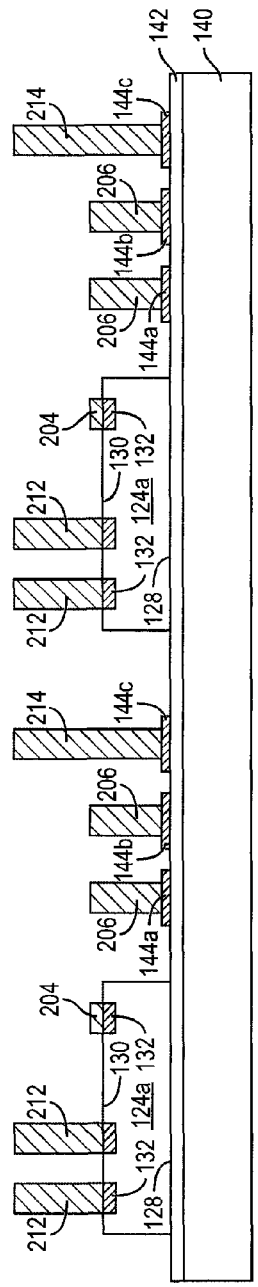

In FIG. 7*g*, photoresist masking layers 200 and 208 are removed leaving z-direction vertical interconnect conductive pillars 212 over contact pads 132 and conductive pillars 214 over contact pads 144*c*. Conductive pillars 204 have a different height than conductive pillars 206 by nature of the different depths of vias 202. Conductive pillars 212 have a different height than conductive pillars 214 by nature of the different depths of vias 210.

Figure 7H:
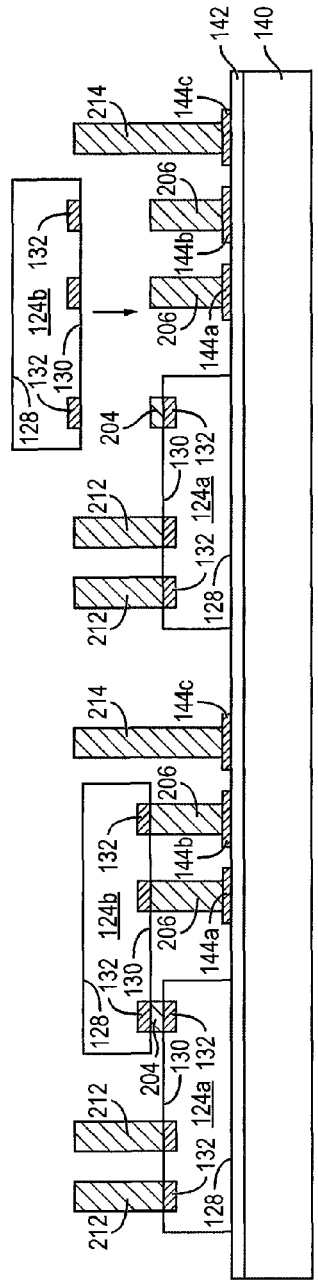

In FIG. 7*h*, semiconductor die 124*b* from FIGS. 3*a*-3*c* are mounted over conductive pillars 204 and 206 with active surface 130 oriented toward carrier 140 using a pick and place operation. A solder paste can be applied over conductive pillars 204 and 206 prior to mounting semiconductor die 124*b* to improve the metallurgical connection. In another embodiment, instead of conductive pillar 204, a bump or stud bump is formed between contact pads 132 in the overlapping portion of semiconductor die 124*a* and 124*b*.

Figure 7I:
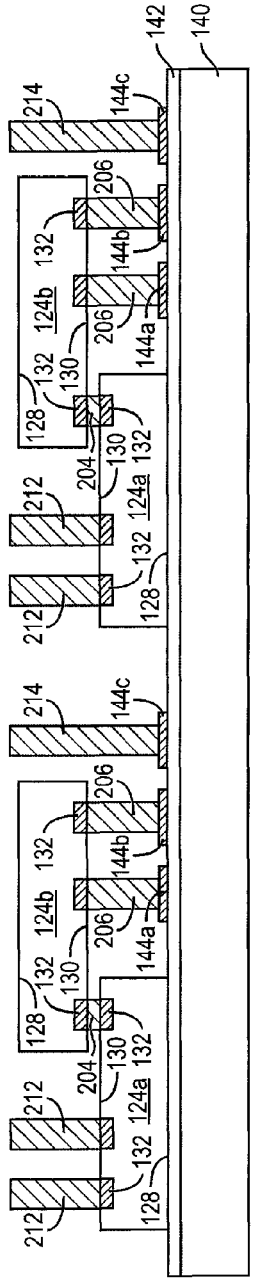

FIG. 7*i* shows contact pads 132 of semiconductor die 124*b* metallurgically and electrically connected through conductive pillars 204 and 206 to contact pads 132 of semiconductor die 124*a* and conductive layer 144*a* and 144*b*. Semiconductor die 124*b* is stacked active surface-to-active surface with a lateral offset with respect to semiconductor die 124*a*. That is, a portion of semiconductor die 124*b* is disposed over a footprint of semiconductor die 124*a*, and a portion of semiconductor die 124*b* is disposed outside the footprint of semiconductor die 124*a*. Consequently, a portion of semiconductor die 124*b* overlaps a portion of semiconductor die 124*a*. Semiconductor die 124*b* can be a different size and have a different electrical function than semiconductor die 124*a*.

Figure 7J:
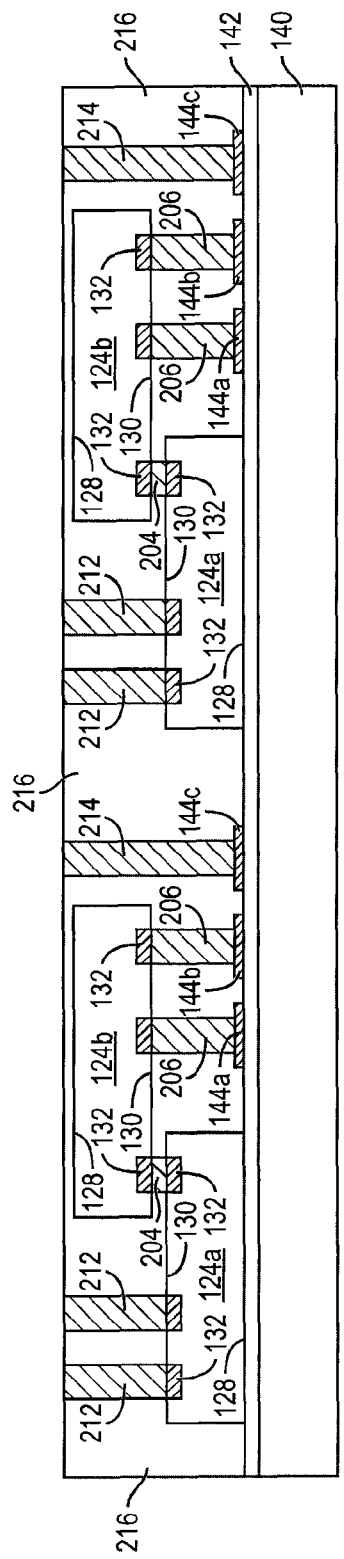

In FIG. 7*j*, an encapsulant or molding compound 216 is deposited over carrier 140, semiconductor die 124*a* and 124*b*, conductive layer 144, and around conductive pillars 204, 206, 212, and 214 using a paste printing, compressive molding, transfer molding, liquid encapsulant molding, vacuum lamination, spin coating, or other suitable applicator. Encapsulant 216 can be polymer composite material, such as epoxy resin with filler, epoxy acrylate with filler, or polymer with proper filler. Encapsulant 216 is non-conductive and environmentally protects the semiconductor device from external elements and contaminants. Wettable contact pads 144 hold semiconductor die 124*a* and 124*b* securely in place to reduce die shifting during encapsulation.

Figure 7K:
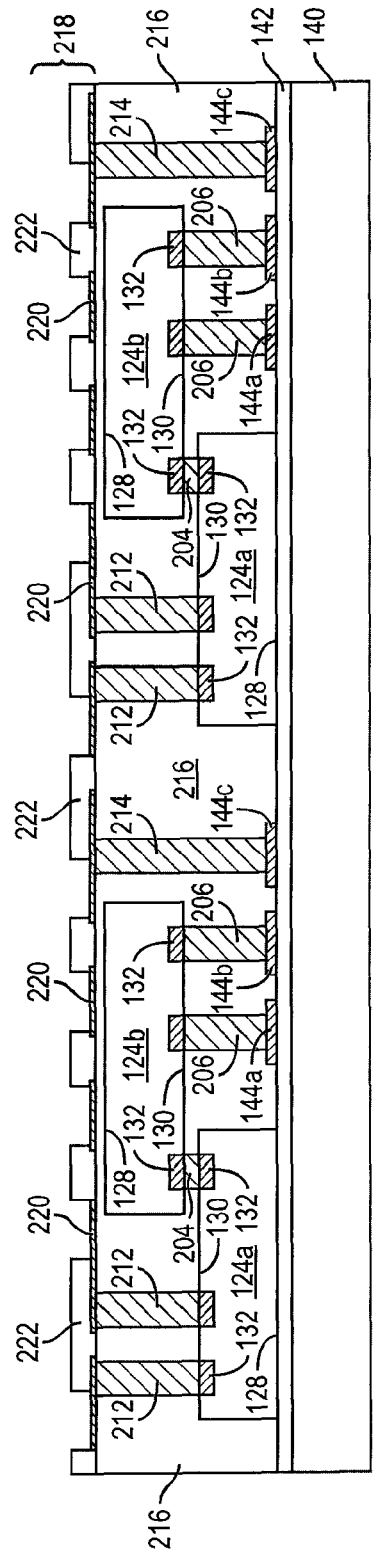

In FIG. 7*k*, a build-up interconnect structure 218 is formed over encapsulant 216, opposite carrier 140. The build-up interconnect structure 218 includes an electrically conductive layer or RDL 220 formed using a patterning and metal deposition process such as sputtering, electrolytic plating, and electroless plating. Conductive layer 220 can be one or more layers of Al, Cu, Sn, Ni, Au, Ag, or other suitable electrically conductive material. One portion of conductive layer 220 is electrically connected to conductive pillars 212 and 214. Other portions of conductive layer 220 can be electrically common or electrically isolated depending on the design and function of semiconductor die 124*a* and 124*b*.

An insulating or passivation layer 222 is formed around conductive layer 220 for electrical isolation using PVD, CVD, printing, spin coating, spray coating, sintering or thermal oxidation. The insulating layer 222 contains one or more layers of SiO2, Si3N4, SiON, Ta2O5, Al2O3, or other material having similar insulating and structural properties. A portion of insulating layer 222 can be removed by an etching process to expose conductive layer 220 for additional electrical interconnect.

Figure 7L:
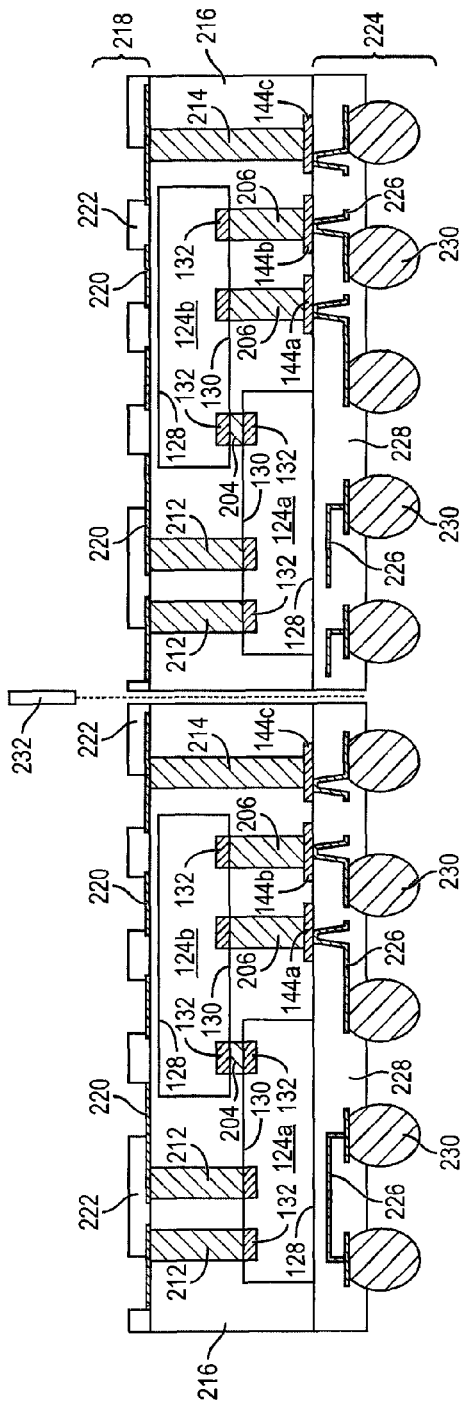

In FIG. 7*l*, carrier 140 and interface layer 142 are removed by chemical etching, mechanical peeling, CMP, mechanical grinding, thermal bake, UV light, laser scanning, or wet stripping to expose semiconductor die 124*a*, conductive layer 144, conductive pillars 206 and 214, and encapsulant 216.

A build-up interconnect structure 224 is formed over semiconductor die 124*a*, conductive layer 144, conductive pillars 206 and 214, and encapsulant 216, opposite build-up interconnect structure 218. The build-up interconnect structure 224 includes an electrically conductive layer or RDL 226 formed using a patterning and metal deposition process such as sputtering, electrolytic plating, and electroless plating. Conductive layer 226 can be one or more layers of Al, Cu, Sn, Ni, Au, Ag, or other suitable electrically conductive material. One portion of conductive layer 226 is electrically connected to conductive pillars 206 and 214. Other portions of conductive layer 226 can be electrically common or electrically isolated depending on the design and function of semiconductor die 124*a* and 124*b*.

An insulating or passivation layer 228 is formed around conductive layer 226 for electrical isolation using PVD, CVD, printing, spin coating, spray coating, sintering or thermal oxidation. The insulating layer 228 contains one or more layers of SiO2, Si3N4, SiON, Ta2O5, Al2O3, or other material having similar insulating and structural properties. A portion of insulating layer 228 can be removed by an etching process to expose conductive layer 226 for additional electrical interconnect.

An electrically conductive bump material is deposited over build-up interconnect structure 224 and electrically connected to the exposed portion of conductive layer 226 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 226 using a suitable attachment or bonding process. In one embodiment, the bump material is reflowed by heating the material above its melting point to form spherical balls or bumps 230. In some applications, bumps 230 are reflowed a second time to improve electrical contact to conductive layer 226. A UBM can be formed under bumps 230. The bumps can also be compression bonded to conductive layer 226, or a combination of reflow temperature and pressure. Bumps 230 represent one type of interconnect structure that can be formed over conductive layer 226. The interconnect structure can also use stud bump, micro bump, or other electrical interconnect.

Semiconductor die 124*a* and 124*b* are singulated through encapsulant 216 and build-up interconnect structures 218 and 224 with saw blade or laser cutting tool 232 into individual Fo-WLCSP, similar to FIG. 5.

Figure 8A:
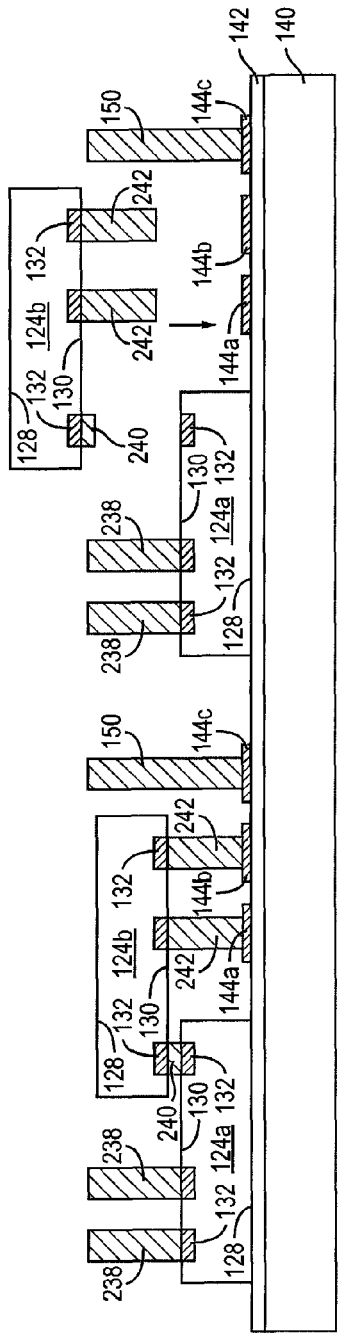
FIGS. 8a-8e illustrate another process of forming different height conductive pillars to electrically interconnect stacked, laterally offset semiconductor die.

FIGS. 8*a*-8*e* illustrate, in relation to FIGS. 1 and 2*a*-2*c*, another process of forming different height conductive pillars to electrically interconnect stacked, laterally offset semiconductor die in a Fo-WLCSP. Continuing from FIG. 4*e*, semiconductor die 124*a* from FIGS. 3*a*-3*c* are mounted over and secured to interface layer 142 with back surface 128 oriented toward carrier 140 using a pick and place operation, as shown in FIG. 8*a*. In this case, conductive pillars 238 are formed over contact pads 132 of semiconductor die 124*a* while in wafer form, see FIGS. 3*a*-3*c*. Conductive pillars 238 can be formed by etching vias in a photoresist masking layer and depositing conductive material in the vias, similar to FIGS. 4*a*-4*i*.

Semiconductor die 124*b* from FIGS. 3*a*-3*c* are mounted over conductive pillars 238 with active surface 130 oriented toward carrier 140 using a pick and place operation. In this case, conductive pillars 240 and 242 are formed over contact pads 132 of semiconductor die 124*b* while in wafer form, see FIGS. 3*a*-3*c*. Conductive pillars 240 and 242 can be formed by etching vias in one or more photoresist masking layers and depositing conductive material in the vias, similar to FIGS. 4*a*-4*i*. A solder paste can be applied over conductive pillars 240 and 242 prior to mounting semiconductor die 124*b* to improve the metallurgical connection. In another embodiment, instead of conductive pillar 240, a bump or stud bump is formed between contact pads 132 in the overlapping portion of semiconductor die 124*a* and 124*b*.

Figure 8B:
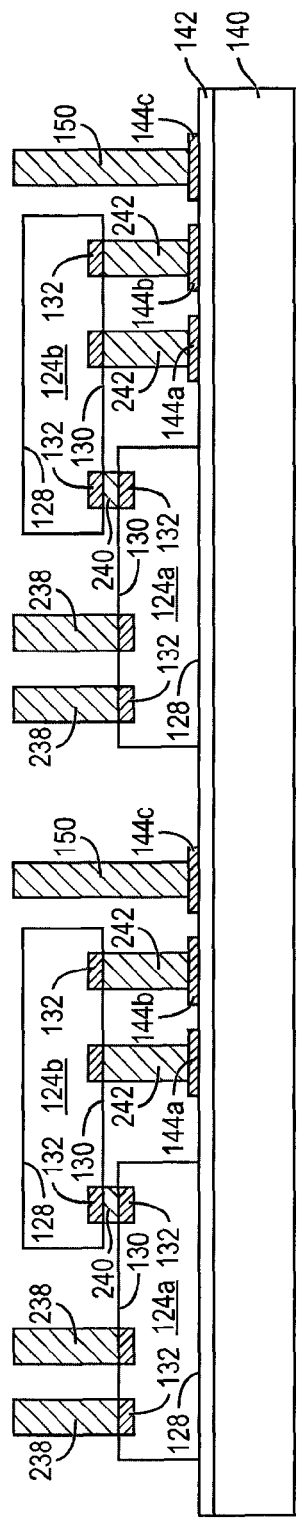

FIG. 8*b* shows contact pads 132 of semiconductor die 124*b* metallurgically and electrically connected through conductive pillars 240 and 242 to contact pads 132 of semiconductor die 124*a* and conductive layer 144*a* and 144*b*. Semiconductor die 124*b* is stacked active surface-to-active surface with a lateral offset with respect to semiconductor die 124*a*. That is, a portion of semiconductor die 124*b* is disposed over a footprint of semiconductor die 124a, and a portion of semiconductor die 124b is disposed outside the footprint of semiconductor die 124a. Consequently, a portion of semiconductor die 124b overlaps a portion of semiconductor die 124a. Semiconductor die 124b can be a different size and have a different electrical function than semiconductor die 124a.

Figure 8C:
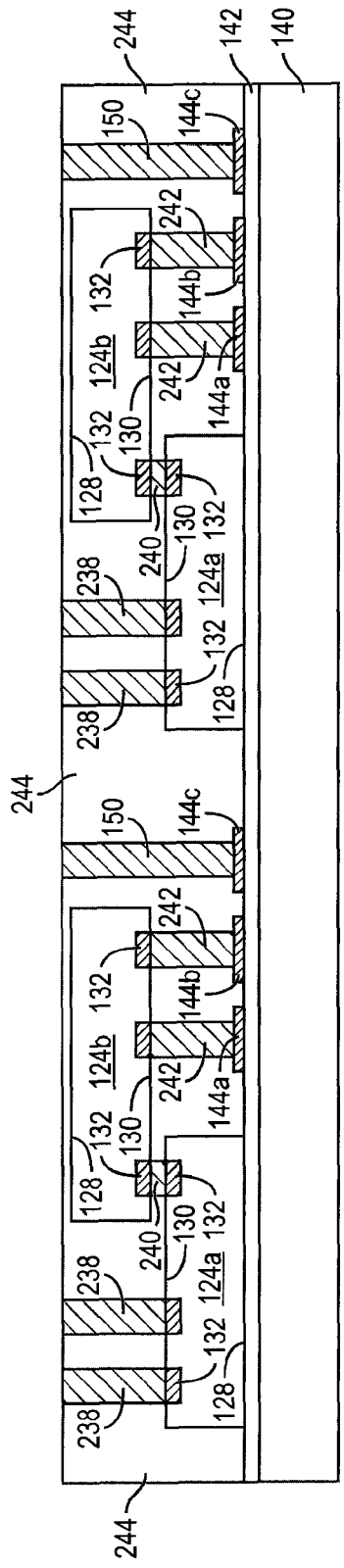

In FIG. 8c, an encapsulant or molding compound 244 is deposited over carrier 140, semiconductor die 124a and 124b, and around conductive pillars 150, 238, 240, and 242 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants. Wettable contact pads 144 hold semiconductor die 124a and 124b securely in place to reduce die shifting during encapsulation.

Figure 8D:
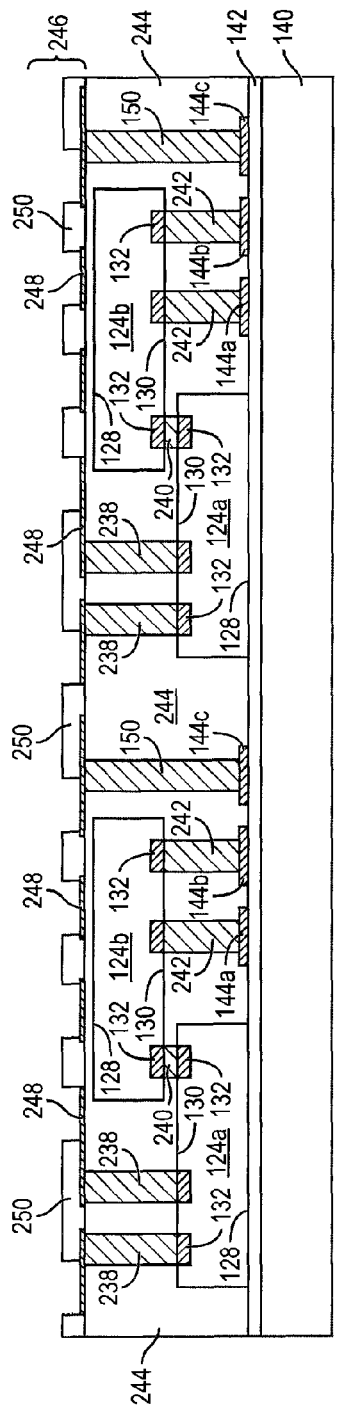

In FIG. 8d, a build-up interconnect structure 246 is formed over encapsulant 244, opposite carrier 140. The build-up interconnect structure 246 includes an electrically conductive layer or RDL 248 formed using a patterning and metal deposition process such as sputtering, electrolytic plating, and electroless plating. Conductive layer 248 can be one or more layers of Al, Cu, Sn, Ni, Au, Ag, or other suitable electrically conductive material. One portion of conductive layer 248 is electrically connected to conductive pillars 150 and 238. Other portions of conductive layer 248 can be electrically common or electrically isolated depending on the design and function of semiconductor die 124a and 124b.

An insulating or passivation layer 250 is formed around conductive layer 248 for electrical isolation using PVD, CVD, printing, spin coating, spray coating, sintering or thermal oxidation. The insulating layer 250 contains one or more layers of SiO2, Si3N4, SiON, Ta2O5, Al2O3, or other material having similar insulating and structural properties. A portion of insulating layer 250 can be removed by an etching process to expose conductive layer 248 for additional electrical interconnect.

Figure 8E:
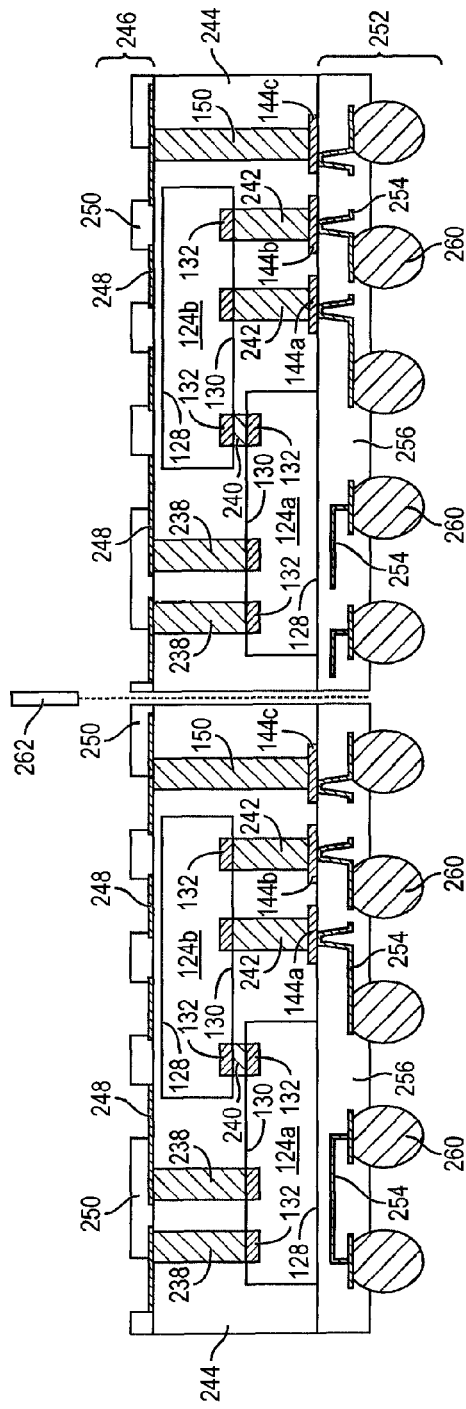

In FIG. 8e, carrier 140 and interface layer 142 are removed by chemical etching, mechanical peeling, CMP, mechanical grinding, thermal bake, UV light, laser scanning, or wet stripping to expose semiconductor die 124a, conductive layer 144, conductive pillars 150 and 242, and encapsulant 244.

A build-up interconnect structure 252 is formed over semiconductor die 124a, conductive layer 144, conductive pillars 150 and 242, and encapsulant 244, opposite build-up interconnect structure 246. The build-up interconnect structure 252 includes an electrically conductive layer or RDL 254 formed using a patterning and metal deposition process such as sputtering, electrolytic plating, and electroless plating. Conductive layer 254 can be one or more layers of Al, Cu, Sn, Ni, Au, Ag, or other suitable electrically conductive material. One portion of conductive layer 254 is electrically connected to conductive pillars 150 and 242. Other portions of conductive layer 254 can be electrically common or electrically isolated depending on the design and function of semiconductor die 124a and 124b.

An insulating or passivation layer 256 is formed around conductive layer 254 for electrical isolation using PVD, CVD, printing, spin coating, spray coating, sintering or thermal oxidation. The insulating layer 256 contains one or more layers of SiO2, Si3N4, SiON, Ta2O5, Al2O3, or other material having similar insulating and structural properties. A portion of insulating layer 256 can be removed by an etching process to expose conductive layer 254 for additional electrical interconnect.

An electrically conductive bump material is deposited over build-up interconnect structure 252 and electrically connected to the exposed portion of conductive layer 254 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 254 using a suitable attachment or bonding process. In one embodiment, the bump material is reflowed by heating the material above its melting point to form spherical balls or bumps 260. In some applications, bumps 260 are reflowed a second time to improve electrical contact to conductive layer 254. A UBM can be formed under bumps 260. The bumps can also be compression bonded to conductive layer 254, or a combination of reflow temperature and pressure. Bumps 260 represent one type of interconnect structure that can be formed over conductive layer 254. The interconnect structure can also use stud bump, micro bump, or other electrical interconnect.

Semiconductor die 124a and 124b are singulated through encapsulant 244 and build-up interconnect structures 246 and 252 with saw blade or laser cutting tool 262 into individual Fo-WLCSP, similar to FIG. 5.

Figure 9:
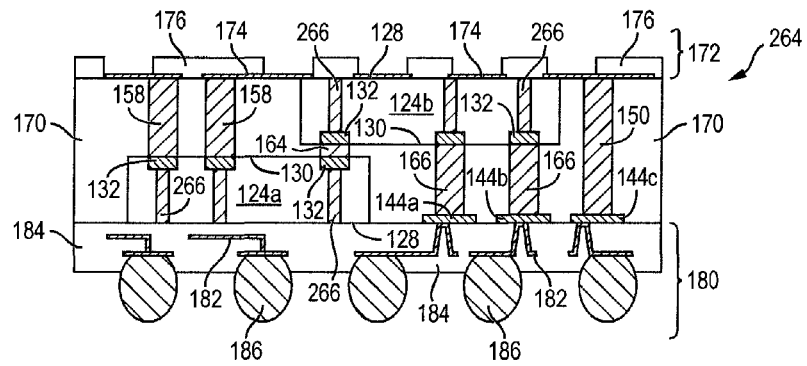
FIG. 9 illustrates a plurality of conductive TSV formed through the semiconductor die.

FIG. 9 shows an embodiment of Fo-WLCSP 264, similar to FIG. 5, with conductive TSV 266 formed through semiconductor die 124a and 124b. A plurality of vias is formed in semiconductor die 124 while in wafer form, see FIGS. 3a-3c, using laser drilling, mechanical drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical conductive TSV 266 for additional electrical interconnect.

Figure 10:
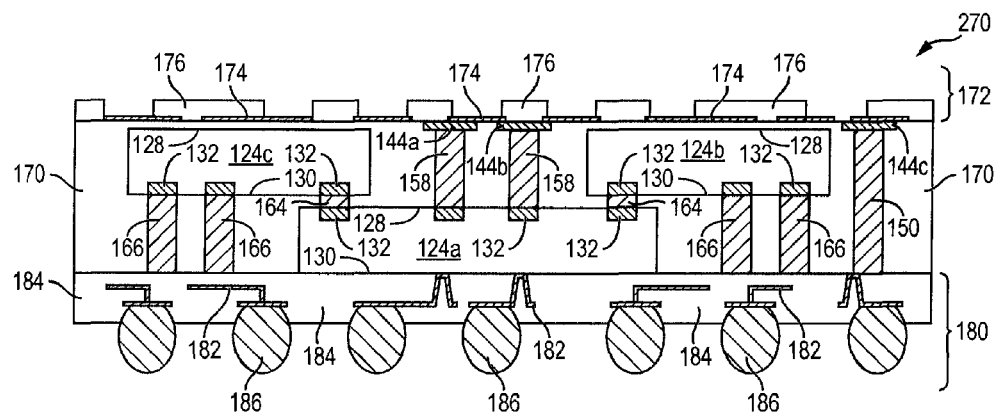
FIG. 10 illustrates a Fo-WLCSP with different height conductive pillars to electrically interconnect two semiconductor die stacked over one semiconductor die.

FIG. 10 shows an embodiment of Fo-WLCSP 270, similar to FIG. 5, with semiconductor die 124b and 124c stacked over and laterally offset with respect to semiconductor die 124a. Semiconductor die 124a is electrically connected through contact pads 132 and conductive pillars 158 to build-up interconnect structure 172 and through conductive pillars 164 to contact pads 132 of semiconductor die 124b. Semiconductor die 124b is electrically connected through contact pads 132 and conductive pillars 166 to build-up interconnect structure 180 and through conductive pillars 164 to contact pads 132 of semiconductor die 124a. Semiconductor die 124c is electrically connected through contact pads 132 and conductive pillars 166 to build-up interconnect structure 180 and through conductive pillars 164 to contact pads 132 of semiconductor die 124a. The build-up interconnect structure 172 is electrically connected through conductive pillars 150 to build-up interconnect structure 180.

Figure 11:
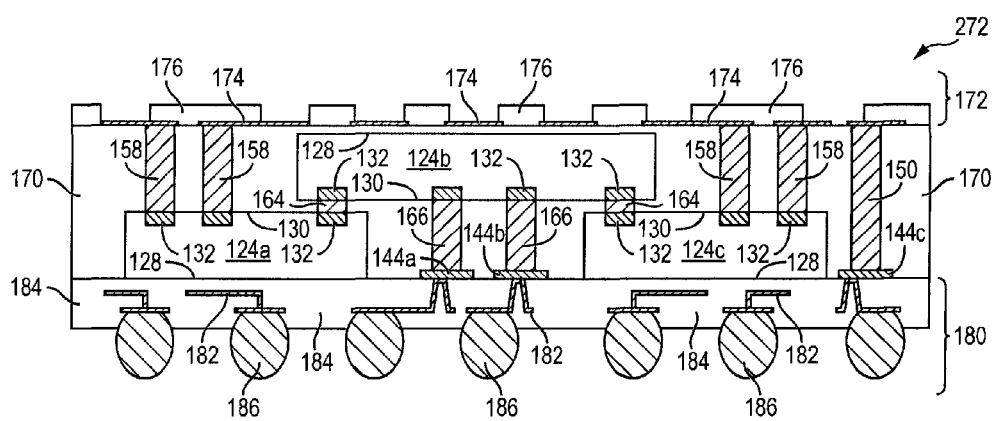
FIG. 11 illustrates a Fo-WLCSP with different height conductive pillars to electrically interconnect one semiconductor die stacked over two semiconductor die.

FIG. 11 shows an embodiment of Fo-WLCSP 272, similar to FIG. 5, with semiconductor die 124b stacked over and laterally offset with respect to semiconductor die 124a and 124c. Semiconductor die 124a is electrically connected through contact pads 132 and conductive pillars 158 to build-up interconnect structure 172 and through conductive pillars 164 to contact pads 132 of semiconductor die 124b. Semiconductor die 124b is electrically connected through contact pads 132 and conductive pillars 166 to build-up interconnect structure 180 and through conductive pillars 164 to contact pads 132 of semiconductor die 124a. Semiconductor die 124c is electrically connected through contact pads 132 and conductive pillars 158 to build-up interconnect structure 172 and through conductive pillars 164 to contact pads 132 of semiconductor die 124b. The build-up interconnect structure 172 is electrically connected through conductive pillars 150 to build-up interconnect structure 180.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die;
   a second semiconductor die disposed over a portion of the first semiconductor die and laterally offset from the first semiconductor die;
   a plurality of first conductive pillars disposed over the first semiconductor die;
   an encapsulant deposited over the first semiconductor die;
   an insulating layer formed on the encapsulant; and
   an electrical interconnect formed between the portion of the first semiconductor die and the second semiconductor die.

2. The semiconductor device of claim 1, wherein the electrical interconnect includes a bump, stud bump, or second conductive pillar.

3. The semiconductor device of claim 1, further including a plurality of second conductive pillars disposed around the first semiconductor die or second semiconductor die.

4. The semiconductor device of claim 1, further including an interconnect structure formed over the encapsulant and electrically connected to the first conductive pillars.

5. The semiconductor device of claim 1, further including a third semiconductor die disposed over the first semiconductor die or second semiconductor die and laterally offset with respect to the first semiconductor die or second semiconductor die.

6. A semiconductor device, comprising:
   a first semiconductor die;
   a second semiconductor die disposed over and laterally offset from the first semiconductor die; and
   a plurality of first conductive pillars disposed over the first semiconductor die and outside a footprint of the second semiconductor die.

7. The semiconductor device of claim 6, further including an encapsulant deposited around the first semiconductor die and second semiconductor die.

8. The semiconductor device of claim 7, further including an interconnect structure formed over the encapsulant and electrically connected to the first conductive pillars.

9. The semiconductor device of claim 6, further including an electrical interconnect formed between the first semiconductor die and second semiconductor die.

10. The semiconductor device of claim 6, further including a plurality of second conductive pillars disposed around the first semiconductor die or second semiconductor die.

11. The semiconductor device of claim 6, further including a plurality of conductive vias formed through the first semiconductor die or second semiconductor die.

12. The semiconductor device of claim 6, further including a third semiconductor die disposed over the first semiconductor die or second semiconductor die and laterally offset with respect to the first semiconductor die or second semiconductor die.

13. A semiconductor device, comprising:
    a first semiconductor die;
    a second semiconductor die disposed over and laterally offset from the first semiconductor die;
    a third semiconductor die disposed over the first semiconductor die and laterally offset from the first and second semiconductor dies;
    a first interconnect structure disposed over the first semiconductor die or second semiconductor die; and
    an encapsulant deposited around the first semiconductor die, second semiconductor die, and first interconnect structure.

14. The semiconductor device of claim 13, wherein the first interconnect structure includes a plurality of conductive pillars disposed over the first semiconductor die and outside a footprint of the second semiconductor die.

15. The semiconductor device of claim 13, further including a plurality of semiconductor devices electrically connected through the first interconnect structure.

16. The semiconductor device of claim 13, further including an electrical interconnect formed between the first semiconductor die and second semiconductor die.

17. The semiconductor device of claim 13, further including a plurality of conductive pillars disposed around the first semiconductor die or second semiconductor die.

18. The semiconductor device of claim 13, further including a second interconnect structure formed over the encapsulant and electrically connected to the first interconnect structure.

19. The semiconductor device of claim 13, further including a plurality of conductive vias formed through the first semiconductor die or second semiconductor die.

20. A semiconductor device, comprising:
    a first semiconductor die;
    a second semiconductor die disposed over and laterally offset from the first semiconductor die;
    a first interconnect structure disposed over the first semiconductor die or second semiconductor die; and
    a second interconnect structure formed outside a footprint of the first and second semiconductor dies.

21. The semiconductor device of claim 20, wherein the first interconnect structure includes a plurality of conductive pillars disposed over the first semiconductor die or second semiconductor die.

22. The semiconductor device of claim 20, further including an encapsulant deposited around the first semiconductor die, second semiconductor die, and first interconnect structure.

23. The semiconductor device of claim 22, further including a third interconnect structure disposed over the encapsulant and electrically connected to the first interconnect structure.

24. The semiconductor device of claim 20, further including an electrical interconnect formed between the first semiconductor die and second semiconductor die.

* * * * *